United States Patent [19]

Kawabe et al.

[11] Patent Number: 5,324,618
[45] Date of Patent: Jun. 28, 1994

[54] POSITIVE TYPE QUINONEDIAZIDE PHOTORESIST COMPOSITION CONTAINING SELECT TETRAPHENOLIC ADDITIVE

[75] Inventors: Yasumasa Kawabe; Shiro Tan; Tadayoshi Kokubo, all of Shizuoka, Japan

[73] Assignee: Fuji Photo Film Co., Ltd., Kanagawa, Japan

[21] Appl. No.: 985,259

[22] Filed: Dec. 3, 1992

[30]  Foreign Application Priority Data

Dec. 4, 1991 [JP]  Japan ................... 3-320438

[51] Int. Cl.$^5$ .................. G03F 7/023; G03C 1/61
[52] U.S. Cl. ....................... 430/191; 430/165; 430/192
[58] Field of Search ............ 430/191, 192, 196; 568/719, 720

[56]  References Cited

U.S. PATENT DOCUMENTS

| | | |
|---|---|---|
| 3,666,473 | 5/1972 | Colom et al. |
| 4,115,128 | 9/1978 | Kita ................... 430/191 |
| 4,173,470 | 11/1979 | Fahrenholtz .......... 430/5 |
| 4,277,600 | 7/1981 | Mark et al. ........... 528/204 |
| 5,077,173 | 12/1991 | Schulz et al. ......... 430/191 |
| 5,112,719 | 5/1992 | Yamada et al. ........ 430/191 |
| 5,188,920 | 2/1993 | Moriuma et al. ....... 430/191 |

OTHER PUBLICATIONS

Introduction to Microlithography, ACS, No. 219, L. P. Thompson, pp. 112-121.

*Primary Examiner*—Charles L. Bowers, Jr.
*Assistant Examiner*—Christopher G. Young
*Attorney, Agent, or Firm*—Sughrue, Mion, Zinn, Macpeak & Seas

[57]  ABSTRACT

Disclosed is a positive type photoresist composition comprising an alkali-soluble resin, a quinone diazide compound and a compound represented by the following general formula (I):

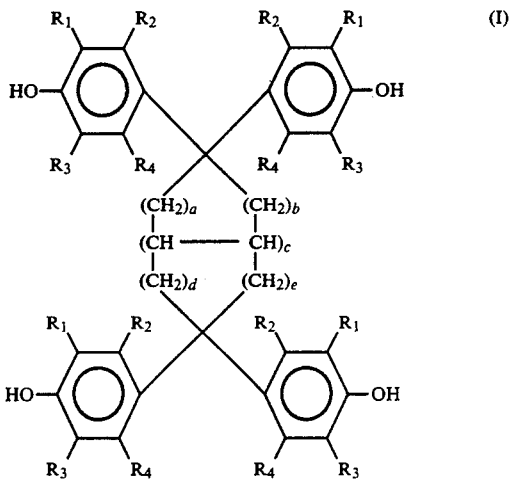

wherein $R_1$, $R_2$, $R_3$ and $R_4$ which may be the same or different and in which four groups for each group may be different from each other at the same time, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group; a, b, d and e each represents 0 or an integer 1 to 3; and c represents 0 or 1, with the proviso that a, b, c, d and e satisfy the relationship $(a+b+c+d+e \geq 2)$, at least one of a and d is 1 or more and at least one of b and e is 1 or more.

10 Claims, No Drawings

POSITIVE TYPE QUINONEDIAZIDE PHOTORESIST COMPOSITION CONTAINING SELECT TETRAPHENOLIC ADDITIVE

FIELD OF INVENTION

The present invention relates to a positive type photoresist composition which is sensitive to radiation. More particularly, the present invention relates to a photoresist composition for fine work which provides high resolution and sensitivity and has an excellently patterned cross section.

A positive type photoresist according to the present invention is coated on a substrate such as semiconducting wafer, glass, ceramics and metal by a spin coating method or a roller coating method to a thickness of 0.5 to 3 μm. The coat material is then heated and dried. A circuit pattern or the like is printed on the material through an exposure mask by irradiation with ultraviolet rays or the like. The material is then subjected to development to obtain a positive image.

Subsequently, the positive image is used as a mask to effect patterned etching on a substrate. Typical applications of positive type photoresist include production of semiconductors such as IC, production of circuit boards such as liquid crystal and thermal head, and photofabrication.

BACKGROUND OF THE INVENTION

Positive type photoresist compositions are normally compositions comprising an alkali-soluble resin and a naphthoquinone diazide compound as a light-sensitive material. Examples of such compositions include novolak type phenol resin/naphthoquinone diazide-substituted compounds as disclosed in U.S. Pat. Nos. 3,666,473, 4,115,128, and 4,173,470. Most typical examples of such compositions include a novolak resin made of cresol formaldehyde/trihydroxybenzophenone-1,2-naphthoquinonediazidosulfonic ester, as disclosed in L. F. Thompson, "Introduction to Microlithography", ACS, No. 219, pp. 112-121.

Novolak resin, a binder, can be dissolved in an alkaline aqueous solution without swelling. The novolak resin can also exhibit a high resistance particularly to plasma etching when an image thus produced is used as a mask for etching. Thus, novolak resin is particularly useful in this application. As a light-sensitive material, a naphthoquinone diazide compound serves as a dissolution inhibitor for reducing the alkali solubility of novolak resin. But it is peculiar in that it undergoes decomposition upon irradiation with light to produce an alkali-soluble substance which rather enhances the alkali solubility of novolak resin. Because of the great change in properties resulting from irradiation with light, a naphthoquinone diazide compound is particularly useful as a light-sensitive material for positive type photoresist.

From this standpoint, many positive type photoresists comprising novolak resin and naphthoquinone diazide light-sensitive material have heretofore been developed and put to practical use. These positive type photoresists have attained sufficient results in working lines of a width of 1.5 to 2 μm.

However, integrated circuits now have greater degree of integration. It is a recent tendency that the working of ultrafine patterns formed of lines of a width of 1 μm or less is required in the production of semiconducting substrates such as SLSI. In such applications, a photoresist having a high resolution, a high accuracy of reproduction of exposure mask pattern and a high sensitivity for high productivity has been desired.

In order to add to the degree of integration in integrated circuits, the etching process has been switched from a conventional wet etching process to a dry etching process. Since the dry etching process causes the temperature of the resist to be elevated, the resist must exhibit a high heat resistance to thermal deformation.

As approaches for improving the heat resistance of the resist, there have been proposed the use of a resin free of a component having a weight-average molecular weight of 2,000 or less as disclosed in JP-A-60-97347 (the term "JP-A" as used herein means an "unexamined published Japanese patent application") and the use of a resin wherein the sum of the content of monomer to trimer is 10% by weight or less as disclosed in JP-A-60-189739.

However, the use of the above mentioned resin free of or having a reduced low molecular component content is disadvantageous in that it normally reduces sensitivity, reducing the throughput in the production of devices.

Some have tried to improve the sensitivity and developability of the resist by blending a specific compound in the resist composition. Thus, JP-A-61-141441 discloses a positive type photoresist composition containing trihydroxybenzophenone. This trihydroxybenzophenone-containing positive type photoresist exhibits an improved sensitivity and developability but shows a deteriorated heat resistance due to the addition of trihydroxybenzophenone.

JP-A-64-44439, JP-A-1-177032, JP-A-1-280748, and JP-A-2-10350 disclose an approach for providing a high sensitivity without deteriorating the heat resistance by incorporating an aromatic polyhydroxy compound other than trihydroxybenzophenone in the system. However, this approach does not necessarily provide sufficient improvement in the developability of the system.

SUMMARY OF THE INVENTION

It is therefore an object of the present invention to provide a positive type photoresist composition which can provide a resist pattern having a high sensitivity and excellent resolution, developability and heat resistance, particularly in the production of semiconductor devices, etc.

This and other objects of the present invention will become more apparent from the following detailed description and examples.

The inventors have found that the above mentioned object of the present invention can be accomplished by the use of an alkali-soluble resin, a quinone diazide compound and a composition having a specific structural formula.

More specifically, the object of the present invention is accomplished with a positive type photoresist composition comprising an alkali-soluble resin, a quinone diazide compound and a compound represented by formula (I):

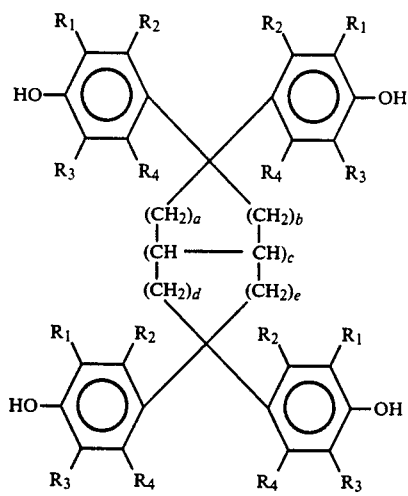

(I)

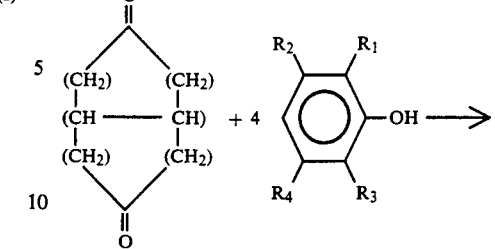

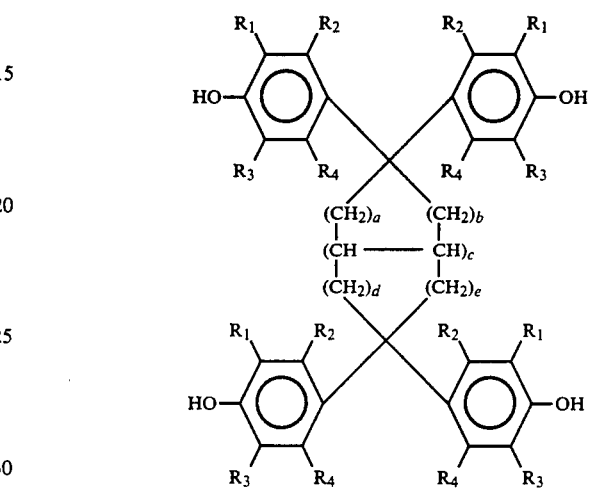

wherein $R_1$, $R_2$, $R_3$ and $R_4$, which may be the same or different and in which four groups for each group may be different from each other at the same time, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group; a, b, d and e each represents 0 or an integer 1 to 3; and c represents 0 or 1, with the proviso that a, b, c, d and e satisfy the relationship $(a+b+c+d+e \geq 2)$, at least one of a and d is 1 or more and at least one of b and e is 1 or more.

DETAILED DESCRIPTION OF THE INVENTION

In formula (I), the halogen atom represented by $R_1$ to $R_4$ is preferably a chlorine atom, bromine atom or iodine atom. The alkyl group represented by $R_1$ to $R_4$ is preferably a $C_{1-4}$ alkyl group such as a methyl, ethyl, propyl, n-butyl, isobutyl, sec-butyl and t-butyl group. The alkoxy group represented by $R_1$ to $R_4$ is preferably a $C_{1-4}$ alkoxy group such as a methoxy, ethoxy, hydroxyethoxy, propoxy, hydroxypropoxy, isopropoxy, n-butoxy, isobutoxy, sec-butoxy and t-butoxy group. The alkenyl group represented by $R_1$ to $R_4$ is preferably a $C_{2-4}$ alkenyl group such as a vinyl, propenyl, allyl and butenyl group.

The aryl group represented by $R_1$ to $R_4$ is preferably a phenyl, xylyl, toluyl or cumenyl group. The aralkyl group represented by $R_1$ to $R_4$ is preferably a benzyl, phenethyl or cumyl group. The alkoxycarbonyl group represented by $R_1$ to $R_4$ is preferably a methoxycarbonyl or ethoxycarbonyl group. The arylcarbonyl group represented by $R_1$ to $R_4$ is preferably a benzoyloxy group. The acyloxy group represented by $R_1$ to $R_4$ is preferably a butyryloxy or acetoxy group. The acyl group represented by $R_1$ to $R_4$ is preferably a formyl, acetyl, butyryl, benzoyl, cyanamoyl or valeryl group. The aryloxy group represented by $R_1$ to $R_4$ is preferably a benzyloxy group. The aralkoxy group represented by $R_1$ to $R_4$ is preferably a phenoxy group.

The compound represented by formula (I) can be obtained by, e.g., the method described in JP-A-56-55328, that is, by allowing the corresponding dione precursor and phenol compound to undergo a reaction under acidic or alkaline condensation conditions.

wherein $R_1$ to $R_4$, and a to e are as defined above. The resulting compound may be in a mixture of two or more kinds thereof.

In the above reaction, an intermediate represented by formula (II) is produced and then converted to the desired compound of the present invention.

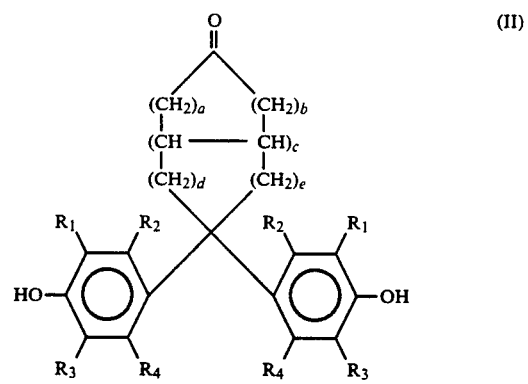

(II)

wherein $R_1$ to $R_4$, and a to e are as defined above.

In the above reaction, the phenol compound is preferably used in an amount exceeding the stoichiometrical value.

In the above reaction, the preferred molar ratio of the dione starting substance to the phenol compound is in the range of 1:4 to 1:30.

If the above reaction is effected under acidic conditions, a catalyst containing mercapto group is preferably used. Examples of such a catalyst include ethanethiol, 1-butanethiol, thiophenol, and mercaptoacetic acid.

The reaction temperature is preferably in the range of 0° to 150° C. The progress of the above reaction can be monitored by chromatography or spectroscopy. Since the above reaction proceeds stepwise, the intermediate (II) can be relatively easily traced.

For example, the reduction in carbonyl absorption band can be analyzed by infrared spectroscopy to relatively trace the intermediate (II).

The purification of these compounds can be carried out by recrystallization, elution chromatography or the like.

Examples of a solvent suitable for recrystallization include methylene chloride, benzene, cyclohexane, methanol, ethanol, and mixture of alcohol and water.

The elution chromatography is preferably effected through alumina or silica with various solvents as eluents.

Specific examples of the compound thus obtained represented by formula (I) include the following compounds [I-a] to [I-j]:

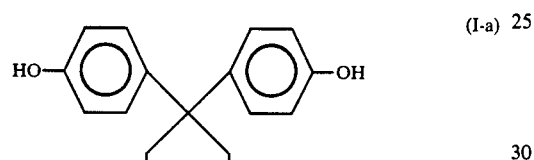
(I-a)

(I-b)

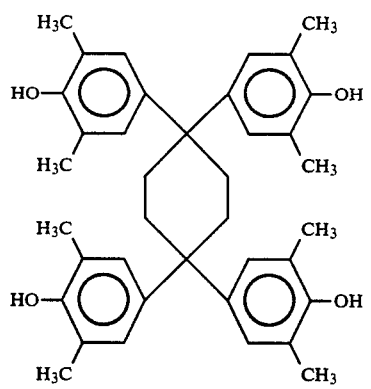

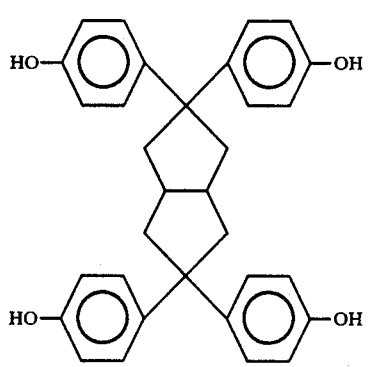
(I-c)

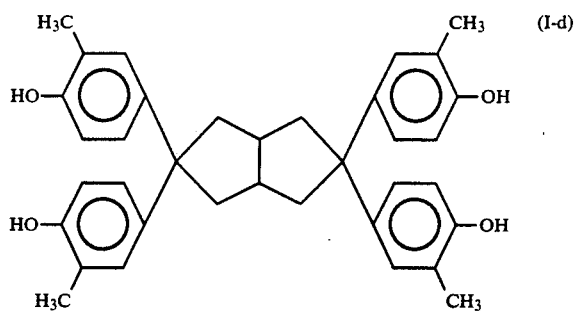
(I-d)

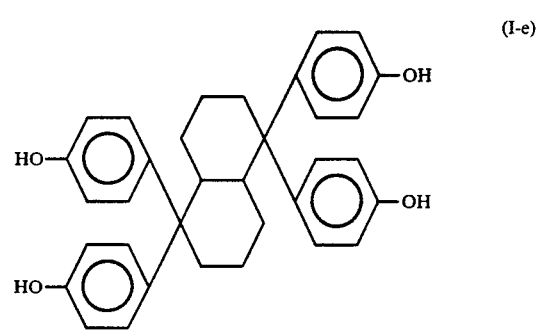
(I-e)

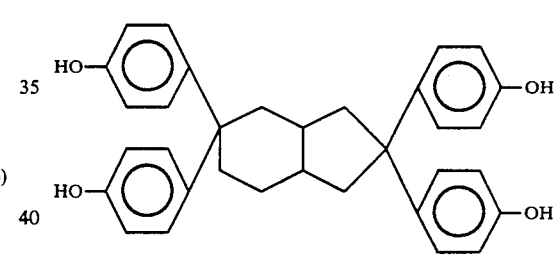
(I-f)

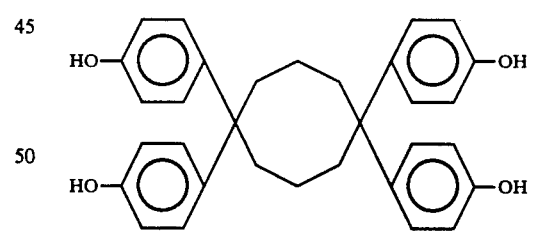
(I-g)

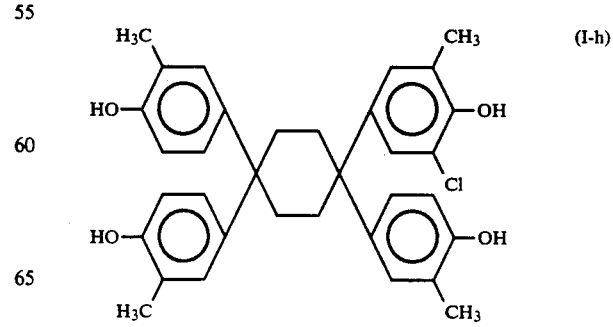
(I-h)

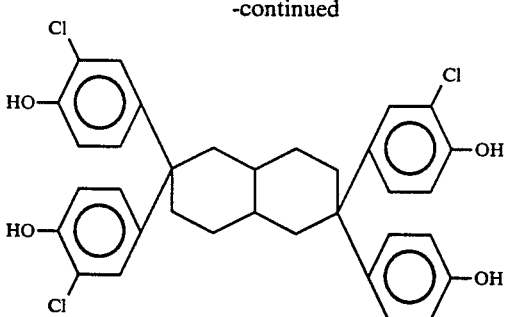

(I-i)

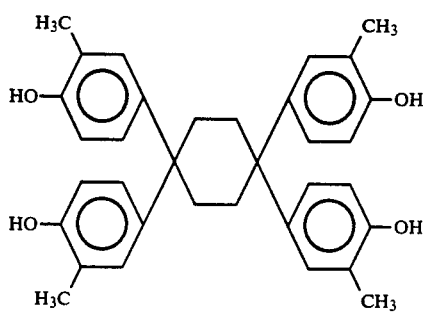

(I-j)

These compounds may be used singly or in combination.

The content of the compound represented by formula (I) to be incorporated in the system is normally in the range of 150 parts by weight or less, preferably 5 to 100 parts by weight, based on 100 parts by weight of quinone diazide compound. If this value falls below 5 parts by weight, the effect of increasing the sensitivity cannot be substantially obtained. On the contrary, if this value exceeds 150 parts by weight, the percent film remaining is remarkably reduced.

Examples of the alkali-soluble resin to be used in the present invention include novolak resin, acetonepyrogallol resin, polyhydroxy styrene, and the derivatives thereof.

Particularly preferred among these alkali-soluble resins is novolak resin. The novolak resin can be obtained by the addition condensation of an aldehyde with a predetermined monomer as a main component in the presence of an acidic catalyst.

Examples of such a predetermined monomer include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as m-chlorophenol, p-chlorophenol, o-chlorophenol, dihydroxybiphenyl, bisphenol A, phenylphenol, resorcinol and naphthol. These monomers may be used singly or in combination. The present invention is not limited to these monomers.

Examples of the aldehydes include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetal compounds thereof, e.g., chloroacetaldehyde diethyl acetal. Preferred among these aldehydes is formaldehyde.

These aldehydes may be used singly or in combination.

The acidic catalyst can be hydrochloric acid, sulfuric acid, formic acid, acetic acid, or oxalic acid.

The weight-average molecular weight of the novolak resin thus obtained is preferably in the range of 2,000 to 30,000. If this value falls below 2,000, the reduction in the film on the unexposed portion after development is increased. On the contrary, if this value exceeds 30,000, the development speed is reduced. The particularly preferred range of the weight-average molecular weight of the novolak resin is from 6,000 to 20,000.

The weight-average molecular weight of the novolak resin is defined by gel permeation chromatography as calculated in terms of polystyrene.

The light-sensitive material to be used in the present invention may comprise a product of esterification of a polyhydroxy compound as described below with 1,2-naphthoquinonediazido-5-(and/or-4-)sulfonylchloride.

Examples of such a polyhydroxy compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone, polyhydroxyphenylalkylketones such as 2,3,4-trihydroxyacetophenone, 2,3,4-trihydroxyphenylpentylketone and 2,3,4-trihydroxyphenylhexylketone, bis((poly)hydroxyphenyl)alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroquaiaretic acid, polyhydroxybenzoates such as propyl 3,4,5-trihydroxybenzoate, phenyl 2,3,4-trihydroxybenzoate and phenyl 3,4,5-trihydroxybenzoate, bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)-methane, bis(2,3,4-trihydroxybenzoyl)benzene and bis(2,4,6-trihydroxybenzoyl)benzene, alkylene di(polyhydroxybenzoate)'s such as ethylene glycol di(3,5-dihydroxybenzoate) and ethylene glycol di(3,4,5-trihydroxybenzoate), polyhydroxybiphenyls such as 2,3,4-diphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol and 2,3,4,2',3',4'-biphenylhexol, bis(polyhydroxy)sulfides such as 4,4'-thiobis(1,3-dihydroxy)benzene, bis(polyhydroxyphenyl)sulfoxides such as 2,2',4,4'-tetrahydroxydiphenyl sulfoxide, bis(polyhydroxyphenyl)sulfones such as 2,2',4,4'-diphenylsulfone, polyhydroxytriphenylmethanes such as 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane and 2,4,6,2',4',6'-hexahydroxy-5,5'-dipropionyltriphenylmethane, polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol and 3,3,3',3'-tetramethyl-1,1'-spirobiindane-4,5,6,5',6',7'-hexol, polyhydroxy phthalides such as 3,3-bis(3,4-dihydroxyphenyl)phthalide, 3,3-bis(2,3,4-trihydroxyphenyl)phthalide and 3',4',5',6'-tetrahydroxyspiro[phthalide-3,9'-xanthene], polyhydroxybenzopyranes such as 2-(3,4-dihydroxyphenyl)-3,5,7-trihydroxybenzopyrane, 2-(3,4,5-trihydroxyphenyl)-3,5,7-trihydroxybenzopyrane, 2-(3,4-dihydroxyphenyl)-3-(3,4,5-trihydroxybenzoyloxy)-5,7-dihydroxybenzopyrane and 2-(3,4,5-trihydroxyphenyl)-3-(3,4,5-trihydroxybenzoyloxy)-5,7-dihydroxybenzopyrane, and flavono dyes such as morin, quercetin and rutin.

Further, oligomers of phenol resin such as novolak resin can be used.

One or a combination of two or more products of the esterification of these polyhydroxy compounds with napthoquinone diazide can be used.

The amount of the light-sensitive material to be used is in the range of 5 to 100 parts by weight, preferably 10 to 50 parts by weight, based on 100 parts by weight of alkali-soluble resin. If this value falls below 5 parts by weight, the percent film remaining is reduced. On the contrary, if this value exceeds 100 parts by weight, the sensitivity and the solubility of the light-sensitive material in the solvent are reduced.

The composition of the present invention may further comprise other polyhydroxy compounds to accelerate its solubility in the developer. Preferred examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensation resin, phloroglucide, 2,4,2',4'-diphenyltetrol, 4,4'-thiobis(1,3-dihydroxy)benzene, 2,2',4,4'-tetrahydroxydiphenylether, 2,2',4,4'-tetrahydroxyphenylsulfoxide, 2,2',4,4'-tetrahydroxydiphenylsulfone, bis(2,4-dihydrooxyphenyl)methane, bis (2,3,4-trihydroxyphenyl)methane, bisphenol A, bisphenol AF, bisphenol S, and bisphenol F.

These polyhydroxy compounds may be blended with the polyhydroxy compound of the present invention in an amount of 50 parts by weight or less, preferably 30 parts by weight or less, based on 100 parts by weight of the polyhydroxy compound of the present invention.

Examples of the solvent for dissolving the light-sensitive material and the alkali-soluble novolak resin of the present invention include ketones such as methyl ethyl ketone and cyclohexanone, ketoethers such as 4-ethoxy-2-butanone and 4-methoxy-4-methyl-2-pentanone, alcohol ethers such as ethylene glycol monomethyl ether and ethylene glycol monoethyl ether, ethers such as dioxane and ethylene glycol dimethyl ether, cellosolve esters such as methyl cellosolve acetate and ethyl cellosolve acetate, aliphatic esters such as butyl acetate, methyl lactate and ethyl lactate, halogenated hydrocarbons such as 1,1,2-trichloroethylene, and high polarity solvents such as dimethyl acetamide, N-methyl pyrrolidone, dimethyl formamide and dimethyl sulfoxide. These solvents may be used singly or in admixture.

The positive type photoresist composition of the present invention may comprise a surface active agent to improve further coating properties such as striation.

Examples of such a surface active agent include nonionic surface active agents such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl allyl ethers (e.g., polyoxyethylene octyl phenol ether, polyoxyethylene nonyl phenol ether), polyoxyethylenepolyoxypropylene block copolymers, sorbitan aliphatic esters (e.g., sorbitan monolaurate, sorbitan monopalmitate, sorbitan monostearate, sorbitan monooleate, sorbitan trioleate, sorbitan tristearate) and polyoxyethylene sorbitan aliphatic esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate), fluorine surface active agents such as Eftop EF301, EF303 and EF352 (produced by Shin-Akita Kasei), Megafac F171, F173 (produced by Dainippon Ink and Chemicals, Incorporated), Florad DC430, DC431 (produced by Sumitomo 3M), and Asahi Guard AG710, Surflon S-382, SC101, SC102, SC103, SC104, SC105, SC106 (Asahi Glass Company, Limited), Organosiloxane polymer KP341 (produced by The Shin-etsu Chemical Industry Co., Ltd.), and acrylic or methyacrylic (co)polymer Polyflow Nos. 75 and 95 (produced by Kyoeisha Yushi kagaku Kogyo K.K.). The amount of such a surface active agent to be blended in the system is normally in the range of 2 parts by weight or less, preferably 1 part by weight or less, based on 100 parts by weight of the alkali-soluble resin and quinone diazide compound in the composition of the present invention.

These surface active agents can be added to the system singly or in combination.

The developer for the positive type photoresist composition of the present invention can be an aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, a cyclic amine such as pyrrole and piperidine. To such an aqueous solution of an alkali may be added an alcohol, surface active agent or the like in a proper amount.

The positive type photoresist composition of the present invention can optionally comprise a dye, plasticizer, adhesion aid, etc.

Specific examples of such a dye include Methyl Violet, Crystal Violet, and Malachite Green. Specific examples of such a plasticizer include stearic acid, acetal resin, phenoxy resin, and alkyd resin. Specific examples of such an adhesion aid include hexamethyl disilazane and chloromethyl silane.

The above mentioned positive type photoresist composition can be coated on a substrate for use in the preparation of precision integrated circuit elements (e.g., silicon/silicon dioxide coat) by a proper means such as spinner and coater, exposed to light through a predetermined mask, and then developed to obtain an excellent resist.

The present invention will be further described in the following examples, but the present invention should not be construed as being limited thereto. The percentage % indicates a value by weight unless otherwise specified.

EXAMPLE

(1) Synthesis of Novolak Resin (A)

40 g of m-cresol, 60 g of p-cresol, 54.0 g of a 37% aqueous solution of formaldehyde and 0.05 g of oxalic acid were charged into a three-necked flask. The material was then heated to a temperature of 100° C. with stirring where it was allowed to undergo reaction. After reaction, the material was cooled to room temperature and its pressure was then reduced to 30 mmHg. The reaction system was then gradually heated to a temperature of 150° C. to remove water and unreacted monomers therefrom. The novolak resin thus obtained exhibited an average molecular weight of 7,900 (as calculated in terms of polystyrene).

(2) Synthesis of Novolak Resin (B)

A cresol novolak resin (molecular weight: 9.400 as calculated in terms of polystyrene) was synthesized from 50% by weight of m-cresol, 50% by weight of p-cresol and an aqueous solution of formaldehyde in the same manner as in synthesis process (1). Low molecular components were then separated from the cresol novolak resin in accordance with Masanobu Kinoshita & Takayuki Otsu, *Experimental Process for Synthesis of High Molecular Compounds*, Kagaku Dojin, page 32, 1973, to obtain a cresol novolak resin having a molecular weight of 10,060 as calculated in terms of polystyrene.

(3) Synthesis of Light-sensitive Material a 11.5 g of 2,3,4-trihydroxybenzophenone, 30.2 g of 1,2-naphthoquinonediazido-5-sulfonyl chloride and 300 ml of acetone were charged into a three-necked flask to make a uniform solution. The reaction solution was then allowed to react at a temperature of 25° C. for 3 hours with a mixture of 11.4 g of triethylamine and 50 ml of acetone gradually added dropwise thereto. The reaction mixture was then poured into 1,500 ml of a 1% aqueous solution of hydrochloric acid. The resulting precipitate was filtered off, washed with water, and then dried at a temperature of 40° C. to obtain 29.8 g of an ester of 2,3,4-trihydroxybenzophenone with 1,2-naphthoquinonediazido-5-sulfonic acid.

(4) Synthesis of Light-sensitive Material b 12.3 g of 2,3,4,4'-tetrahydroxybenzophenone, 40.3 g of 1,2-naphthoquinonediazido-5-sulfonyl chloride and 300 ml of acetone were charged into a three-necked flask to make a uniform solution. The reaction solution was then allowed to react at a temperature of 25° C. for 3 hours with a mixture of 15.2 g of triethylamine and 50 ml of acetone gradually added dropwise thereto. The reaction mixture was then poured into 1,500 ml of a 1% aqueous solution of hydrochloric acid. The resulting precipitate was filtered off, washed with water, and then dried at a temperature of 40° C. to obtain 39.7 g of an ester of 2,3,4,4'-tetrahydroxybenzophenone with 1,2-naphthoquinonediazido-5-sulfonic acid.

(5) Synthesis of Compound [I-a]: 1,1,4,4-tetrakis(4-hydroxyphenyl)cyclohexane Into a molten mixture of 300 g (3.2 mole) of phenol and 22.4 g (0.2 mole) of 1,4-cyclohexanedione (m.p. 78° C.) was introduced hydrochloric acid gas at a temperature of 50° C. to saturation.

The reaction mixture thus obtained was allowed to stand at a temperature of 50° C. until the separation of a white solid content was completed.

After reaction, the precipitate was filtered off. The filter cake was then washed with methylene chloride until there was no phenol. The resulting colorless crystal [I-a] was found by gas chromatography to exhibit a purity of 99.8% and a melting point of 329° C.

(6) Synthesis of Compound [I-b]: 1,1,4,4-tetrakis(4-hydroxy-3,5-dimethyl)cyclohexane Compound [I-b] was synthesized in the same manner as in Synthesis Example (5) except that phenol was replaced by 400 g of 2,6-xylenol and 1 ml of 1-butanethiol co-catalyst was added to the system.

After the completion of the reaction was confirmed by gas chromatography, the precipitated crystal was filtered off, and then washed with methylene chloride to remove 2,6-xylenol. The resulting white crystal [I-b] was found by gas chromatography to exhibit a purity of 100% and a melting point of 333° C.

(7) Synthesis of Compound [I-c]: 3,3,7,7-tetrakis(4-hydroxyphenyl)bicyclo[3.3.0]octane Compound [I-c] was synthesized in the same manner as in Synthesis Example (5) except that 1,4-cyclohexanedione was replaced by 27.6 g (0.2 mole) of bicyclo[3.3.0]octane-3,7-dione (m.p. 85° C.).

After the separation of the crystalline precipitate was completed to finish the reaction, the reaction mixture was filtered off, and then washed with methylene chloride. The material was then recrystallized from a mixture of methanol and water to obtain a colorless crystal. The crystal was found by gas chromotography to exhibit a purity of 99.7% and a melting point of 319° C.

(8) Synthesis of Compound [I-d]: 3,3,7,7-tetrakis(4-hydroxy-3-methylphenyl)bicyclo[3.3.0]octane Compound [I-d] was synthesized in the same manner as in Synthesis Example (5) except that phenol was replaced by o-cresol.

The progress of the reaction was monitored by gas chromatography. After the completion of the reaction, extra o-cresol was distilled off under reduced pressure established by a water aspirator. The solid residue was then recrystallized from a mixture of methanol and water. The resulting compound [I-d] was found by gas chromatography to exhibit a purity of 99.9% and a melting point of 281° C.

(9) Preparation and Evaluation of Positive Type Photoresist Composition

The cresol novolak resin (A) and (B) obtained in Synthesis Examples (1) and (2), respectively, the light-sensitive material a and b obtained in Synthesis Examples (3) and (4), respectively, and the additives (1) to (8) set forth in Table 1 were dissolved in 15 g of ethyl cellosolve acetate in the proportions set forth in Table 2. The material was filtered through a microfilter having a pore diameter of 0.2 μm to prepare a photoresist composition. The photoresist composition was coated on a silicon wafer by a spinner, and then dried by a vacuum hot plate at a temperature of 100° C. for 90 seconds to obtain a resist film having a thickness of 1.2 μm.

The resist film was exposed to light through a test chart mask by means of a reduction projection exposing apparatus FPA-1550 available from Canon Inc., developed with a 2.38% aqueous solution of tetramethyl ammonium hydroxide for 1 minute, washed with water for 30 seconds, and then dried.

The resist pattern thus formed on the silicon wafer was observed under a scanning type electron microscope for evaluation. The results are set forth in Table 3.

TABLE 1

| No. | Compounds Used as Additives |
| --- | --- |
| | Compound |
| 1 | Compound [I-a] of Synthesis Example (5) |
| 2 | Compound [I-b] of Synthesis Example (6) |
| 3 | Compound [I-c] of Synthesis Example (7) |
| 4 | Compound [I-d] of Synthesis Example (8) |
| 5 | 2,3,4-Trihydroxybenzophenone |
| 6 | 2,3,4,4'-Tetrahydroxybenzophenone |
| 7 | 2,3,4,3',4',5'-Hexahydroxybenzophenone |
| 8 | 2,2',4,4'-Tetrahydroxydiphenylsulfide |

TABLE 2

| Example No. | Formulation of Resist Composition | | |
| --- | --- | --- | --- |
| | Novolak resin (g) | Light-sensitive material (g) | Additive (g) |
| Example 1 | (A) 5 | (a) 1.25 | (1) 0.38 |
| 2 | (A) 5 | (a) 1.25 | (2) 0.34 |
| 3 | (A) 5 | (b) 1.25 | (3) 0.38 |
| 4 | (A) 5 | (b) 1.25 | (4) 0.32 |
| 5 | (A) 5 | (b) 1.35 | (1) 0.41 |
| 6 | (B) 5 | (a) 1.40 | (2) 0.39 |
| 7 | (B) 5 | (b) 1.40 | (3) 0.41 |
| 8 | (B) 5 | (b) 1.50 | (4) 0.45 |
| Comparative 1 | (A) 5 | (a) 1.25 | None — |
| 2 | (A) 5 | (a) 1.25 | (5) 0.38 |
| 3 | (A) 5 | (b) 1.25 | (6) 0.38 |
| Example 4 | (B) 5 | (b) 1.35 | (7) 0.41 |
| 5 | (B) 5 | (a) 1.50 | (8) 0.45 |

TABLE 3

| Example No. | Results of Evaluation | | | | | |
| --- | --- | --- | --- | --- | --- | --- |
| | Relative sensitivity | Film remaining (%) | Resolving power (μm) | Heat resistance (°C.) | Resist shape (θ) | Developability |
| Example 1 | 1.2 | 98 | 0.50 | 140 | 89 | E |
| 2 | 1.3 | 99 | 0.50 | 140 | 88 | E |
| 3 | 1.2 | 99 | 0.50 | 145 | 88 | E |
| 4 | 1.3 | 98 | 0.50 | 135 | 87 | E |
| 5 | 1.3 | 99 | 0.50 | 135 | 87 | E |
| 6 | 1.2 | 99 | 0.50 | 140 | 87 | E |
| 7 | 1.2 | 99 | 0.50 | 145 | 88 | E |
| 8 | 1.2 | 99 | 0.50 | 145 | 86 | E |
| Comparative 1 | 1.0 | 98 | 0.52 | 135 | 85 | P |
| 2 | 1.1 | 95 | 0.52 | 125 | 82 | E |
| 3 | 1.1 | 97 | 0.52 | 130 | 83 | F |
| Example 4 | 1.0 | 95 | 0.55 | 135 | 82 | F |
| 5 | 0.9 | 96 | 0.55 | 135 | 82 | F |

The sensitivity is defined as the reciprocal of the exposure reproducing a 0.70 μm mask pattern, represented relative to the value of Comparative Example 1.

The percent film remaining is the percentage of retained film from before to after development.

The resolving powder indicates the threshold resolving powder at the exposure reproducing a 0.70 μm mask pattern.

The heat resistance indicates the temperature at which the silicon wafer on which a resist pattern has been formed shows no pattern deformation after baking in a convection oven for 30 minutes.

The resist shape is represented by the angle (θ) of the surface of the resist wall with the plane of the silicon wafer in the section of 0.70 μm resist pattern.

For evaluation of developability, when no surface peeling and film residue are observed the developability is considered E (excellent), when substantial surface peeling and film residue are observed it is considered P (poor), and when slight surface peeling and film residue are observed it is considered F (fair).

The results in Table 3 show that the resists comprising the additives (1) to (4) of the present invention exhibit excellent sensitivity, percent film remaining, resolving power, heat resistance, resist shape and developability.

The positive type photoresist composition of the present invention exhibits excellent resolving power, sensitivity, developability and heat resistance and thus can be used as a photoresist for fine working.

While the invention has been described in detail and with reference to specific embodiments thereof, it will be apparent to one skilled in the art that various changes and modifications can be made therein without departing from the spirit and scope thereof.

What is claimed is:

1. A positive photoresist composition, comprising an admixture of an alkali-soluble resin, a quinone diazide compound and a compound represented by formula (I):

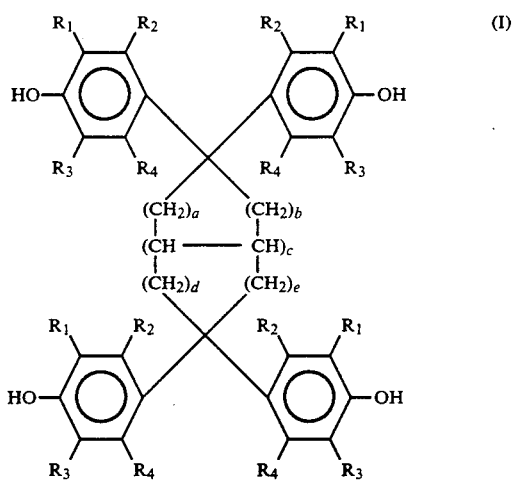

wherein $R_1$, $R_2$, $R_3$ and $R_4$, which may be the same or different and in which four groups for each group may be different from each other at the same time, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or aralkoxy group; a, b, d, and e each represents 0 or an integer 1 to 3; and c represents 0 or 1, with proviso that a, b, c, d and e satisfy the relationship $(a+b+c+d+e \geq 2)$, at least one of a and d is 1 or more and at least one of b and e is 1 or more; wherein the compound according to formula (I) is present in an amount from 5 to 150 parts by weight based upon 100 parts by weight of the quinone diazide.

2. The positive photoresist composition according to claim 1, wherein at least one of $R_1$ to $R_4$ is a chlorine, bromine or iodine atom.

3. The positive photoresist composition according to claim 1, wherein at least one of $R_1$ to $R_4$ is a $C_{1-4}$ alkyl group.

4. The positive photoresist composition according to claim 1, wherein at least one of $R_1$ to $R_4$ is a $C_{1-4}$ alkoxy group.

5. The positive photoresist composition according to claim 1, wherein at least one of $R_1$ to $R_4$ is a $C_{2-4}$ alkenyl group.

6. The positive photoresist composition according to claim 1, wherein at least one of $R_1$ to $R_4$ is a phenyl, xylyl, toluyl or cumenyl group.

7. The positive photoresist composition according to claim 1, wherein at least one of $R_1$ to $R_4$ is a benzyl, phenethyl or cumyl group.

8. The positive photoresist composition according to claim 1, wherein at least one of $R_1$ to $R_4$ is a methoxycarbonyl or ethoxycarbonyl group.

9. The positive photoresist composition according to claim 1, wherein at least one of $R_1$ to $R_4$ is a benzoyloxy group.

10. The positive photoresist composition according to claim 1, wherein at least one of $R_1$ to $R_4$ is a butyryloxy, acetoxy, formyl, acetyl, butyryl, benzoyl, cyanamoyl, valeryl, benzyloxy or phenoxy group.

* * * * *